(12) United States Patent
Kim

(10) Patent No.: US 6,215,721 B1
(45) Date of Patent: Apr. 10, 2001

(54) MULTI-BANK MEMORY DEVICE AND METHOD FOR ARRANGING INPUT/OUTPUT LINES

(75) Inventor: Keum Yong Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/499,576

(22) Filed: Feb. 7, 2000

(30) Foreign Application Priority Data

Sep. 3, 1999 (KR) .................................................. 99-37280

(51) Int. Cl.[7] ...................................................... G11C 8/00
(52) U.S. Cl. ........................................................ 365/230.03
(58) Field of Search ........................... 365/51, 63, 230.03, 365/230.06

(56) References Cited

U.S. PATENT DOCUMENTS

| | | | |
|---|---|---|---|
| 5,781,495 | * 7/1998 | Arimoto | 365/63 |
| 5,999,480 | * 12/1999 | Ong et al. | 365/230.03 |
| 6,028,811 | * 2/2000 | Brown | 365/230.03 |
| 6,078,542 | * 6/2000 | Tomishima | 365/230.03 |
| 6,091,659 | * 7/2000 | Watanabe et al. | 365/230.03 |
| 6,111,774 | * 8/2000 | Shirley | 365/51 |

* cited by examiner

*Primary Examiner*—Trong Phan
(74) *Attorney, Agent, or Firm*—F. Chau & Associates, LLP

(57) ABSTRACT

A method for arranging I/O lines in a multi-memory bank having, a plurality of memory banks, an I/O sense amplifier block, a plurality of I/O sense amplifiers, a plurality of column-decoder blocks, a plurality of local I/O line pairs, and a plurality of global I/O line pairs. Memory chip operating efficiency is improved, for example, by dividing a plurality of memory banks by an I/O sense amplifier block, alternating the positions of I/O line transfer transistors and sense amplifier driving transistors, and intersecting global I/O line pairs thereby easing bank addressing and enhancing the speed of operation.

22 Claims, 5 Drawing Sheets

MULTI-BANK MEMORY DEVICE AND METHOD FOR ARRANGING INPUT/ OUTPUT LINES

BACKGROUND OF THE INVENTION

1. Field of the Invention

The present invention relates to a multi-bank semiconductor memory device and a method for arranging input and output (I/O) lines. More particularly, the invention relates to an improved architecture leading to efficiency in chip manufacture and design.

2. Description of the Related Art

A semiconductor memory device may employ different architecture such as multi-bit architecture or multi-bank architecture to enhance performance. In multi-memory bank architecture, memory banks can be readily accessed independently and selectively by a bank address method.

In such a multi-memory bank architecture, a write operation, a read operation, and an interrupt operation can be performed in different memory banks. The multi-memory bank architecture includes a bank data bus, which may be a global I/O line, carrying the data read from each memory bank and the data to be written.

Further, each memory bank is divided into a plurality of memory blocks according to the increasing number of memory cells included in one memory bank. The plurality of memory blocks are connected to global I/O lines through a plurality of local I/O lines. Accordingly, each memory block should include sense amplifier blocks, word-line driving blocks, sense amplifier driving circuits, and line transfer circuits because each memory bank is divided into a plurality of memory blocks.

The above-described multi-memory bank architecture is disclosed in U.S. Pat. No. 5,781,495. Specifically, the disclosed architecture includes a plurality of global I/O line pairs passing through the upper side of a memory cell array and extended across a plurality of memory banks.

The efficiency of such multi-memory bank architecture suffers however due to the added size.

Therefore a need exists for a multi-memory bank architecture to improve cell efficiency and chip efficiency.

SUMMARY OF THE INVENTION

One object of the present invention is to provide a multi-bank semiconductor memory device and a method for arranging I/O lines for improving chip efficiency by dividing a plurality of memory banks with I/O sense amplifier blocks.

Another object of the present invention is to provide a multi-bank semiconductor memory device and a method for arranging I/O lines which increases the efficiency of chip manufacture and design by alternately disposing I/O line transfer transistors and sense amplifier driving transistors.

Still another object of the present invention is to provide a multi-bank semiconductor memory device and a method for arranging I/O lines for ease of bank addressing by crossing global I/O line pairs.

Another object of the present invention is to provide a multi-bank semiconductor memory device and a method for arranging I/O lines to increase chip operating speed through an equalizing operation of global I/O line pairs in a write-interrupt-read mode.

To accomplish the above-mentioned objects, a device of the present invention comprises: a plurality of memory banks arranged in the direction of a row; an I/O sense amplifier block which is disposed between adjacent pairs of a plurality of the memory banks, and which includes a plurality of I/O sense amplifiers arranged in the direction of a column; a plurality of column-decoder blocks disposed between each adjacent pair of the memory banks; a plurality of local I/O line pairs extended in each of the memory banks through each memory block therein, in the direction of a column; a plurality of global I/O line pairs, which are extended in one memory bank of each adjacent pair of the memory banks in the direction of a row, which intersect each other on each column-decoder block, and which are extended in the other memory bank in the direction of the other row in the word-line driving block previously containing the intersecting global I/O line pairs.

Each pair of local I/O line pair is preferably disposed on a plurality of sense amplifier block columns arranged in each memory bank in the direction of a row. A pair of local I/O line pair is disposed on each sense amplifier block column. Each pair of the global I/O line pair is disposed on a plurality of word-line driving block rows, the word-line driving blocks are arranged in each memory bank in the direction of a column. A pair of the global I/O lines is disposed at each of the word-line driving block rows. Each of the global I/O line pair is connected with the local I/O line pair crossed at the identical word-line driving block row by having an identical address. In memory banks where global I/O line pairs are not connected with the local I/O line pairs, the global I/O line pair is disposed on adjacent word-line driving block rows. The sense amplifier block columns and sense amplifier driving circuit blocks are disposed in the region of word-line driving block rows where the global I/O line pairs are not connected to the local I/O line pairs. Each of the plurality of global I/O line pairs includes a plurality of equalizer means, which are connected to an end point, and middle points between each memory bank and column-decoder. A plurality of the equalizer means perform an equalizing operation in a write-interrupt-read mode.

According to the present invention, a method for arranging I/O lines of a multi-bank semiconductor memory device having a plurality of I/O sense amplifiers in the direction of a column between adjacent pairs of a plurality of memory banks arranged in the direction of a row, comprises the following steps of: arranging a plurality of local I/O line pairs in the direction of a row, which are extended in each memory bank in the direction of a column, having a column-decoder disposed between each adjacent memory bank in a memory area; and arranging a plurality of global I/O line pairs, which are extended in one memory bank of each adjacent pair of the memory banks in the direction of a row, which intersect each other on each column-decoder block, and which are extended in the other memory bank in the direction of the other row in the word-line driving block previously containing the intersecting global I/O line pairs.

Wherein, it is preferred that each of the plurality of global I/O line pair includes a plurality of equalizer means which are connected to an end point, and middle points between each memory bank and column-decoder. The plurality of equalizer means perform an equalizing operation in a write-interrupt-read mode.

Also, a device of the present invention comprises: a pair of element formation areas divided on a semiconductor wafer; a peripheral circuit area disposed on the center of the element formation area for dividing each element formation area into a pair of sub-element formation areas; an input/output sense amplifier block disposed on the center of the sub-element formation area for dividing each sub-element formation area into a pair of memory areas; a column-decoder block disposed on the center of the memory area for dividing each memory area into a pair of memory banks; and a plurality of global I/O line pairs.

Wherein, a first pair of global I/O line pair is extended in a memory bank adjacent to an I/O sense amplifier block in the direction of a first row. A second pair of global I/O line pair is extended in the direction of a second row adjacent to the first row. The four global I/O line pair intersect each other on the column-decoder block. The first pair of global I/O line pair is extended on other memory bank adjacent to the column-decoder in the direction of the second row. The second pair of global I/O line pair is extended in the first row. The global I/O line pairs are repeatedly disposed in the direction of a column.

Global I/O line pairs are connected to I/O sense amplifiers different from each other, respectively. The first pair of global I/O line pair of the intersecting global I/O line pairs are connected to local I/O line pairs in a first memory bank. The second pair of global I/O line pair of the intersecting global I/O line pairs are connected to local I/O lines pairs in a second memory bank. Global I/O line pair connect to local I/O line pair having the identical addresses in each memory bank in an I/O sense amplifier. The local I/O line pairs are disposed on a plurality of sense amplifier block columns arranged on each memory bank in the direction a row, respectively. One pair of local I/O line pair is disposed on each sense amplifier block column. Each pair of global I/O line pair is disposed on a plurality of word-line driving block rows. The word-line driving blocks are arranged in each memory bank in the direction of a column. One pair of global I/O line pair is disposed in each word-line driving block row. Each global I/O line pair is connected to the local I/O line pair intersected at word-line driving block row arranged along a first row of each memory bank having the identical address with the local I/O line pair. A sense amplifier driving circuit block is disposed at the intersection of word-line driving block rows arranged along a second row and the sense amplifier block columns. Each global I/O line pair includes a plurality of equalizer means that are connected to an end point, and middle points between each memory bank and column-decoder block. And the plurality of equalizer means perform an equalizing operation in a write-interrupt-read mode.

Further objects and advantages of the invention can be more fully understood from the following detailed description taken in conjunction with the accompanying drawings.

DETAILED DESCRIPTION OF THE INVENTION

Figure 1:
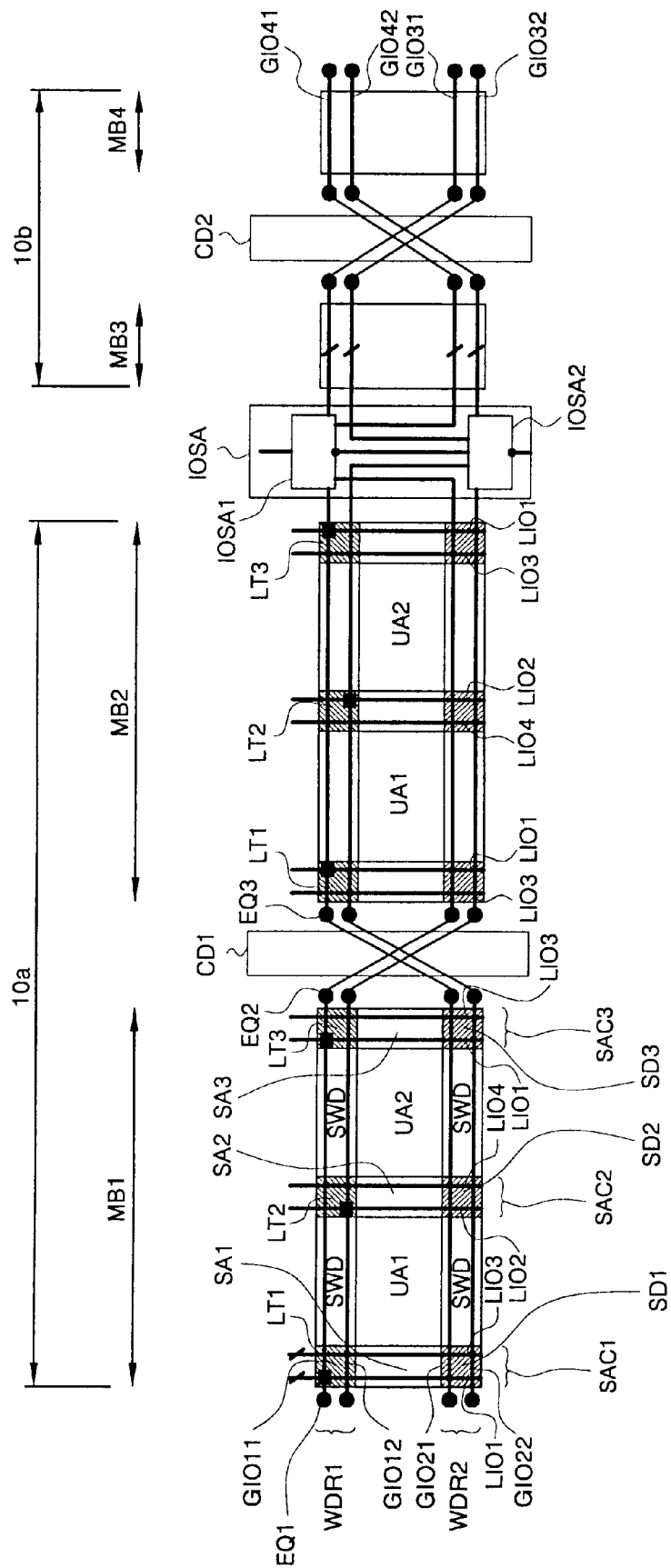
FIG. 1 is a schematic diagram of a multi-bank memory device with crossed global I/O pairs according to the present invention.

Referring to FIG. 1, a memory device includes memory bank pairs 10a and 10b, and an I/O line sense amplifier block IOSA. The memory bank pair 10a includes a first memory bank MB1, a first column-decoder block CD1 and a second memory bank MB2. The memory bank pair 10b includes a third memory bank MB3, a second column-decoder block CD2 and a fourth memory bank MB4. Each memory bank MB1~MB4 is divided into a plurality of memory blocks, and each memory block includes two unit arrays UA1 and UA2. Each memory block is divided into unit array columns by sense amplifier blocks SA1, SA2 and SA3. Each pair unit arrays is divided into rows by word-line driving blocks SWD.

Sense amplifier driving circuit blocks SD1~SD4 and line transfer circuit blocks LT1~LT4 are alternately disposed in the direction of a column, at each intersection of sense amplifier block columns SAC1~SAC3 and word-line driving block rows WDR1 and WDR2.

Each pair of the local I/O line pairs (LIO1, LIO3), (LIO2, LIO4) and (LIO1, LIO3) passes over one of the sense amplifier blocks SAC1~SAC3.

Each pair of the global I/O line pairs (GIO11, GIO12) and (GIO21, GIO22) passes over the word-line driving block rows WDR1 and WDR2 alternately. Each global I/O line pair passing over a first word-line driving block in a first memory bank and a second word-line driving block in a second memory bank.

Figure 4:
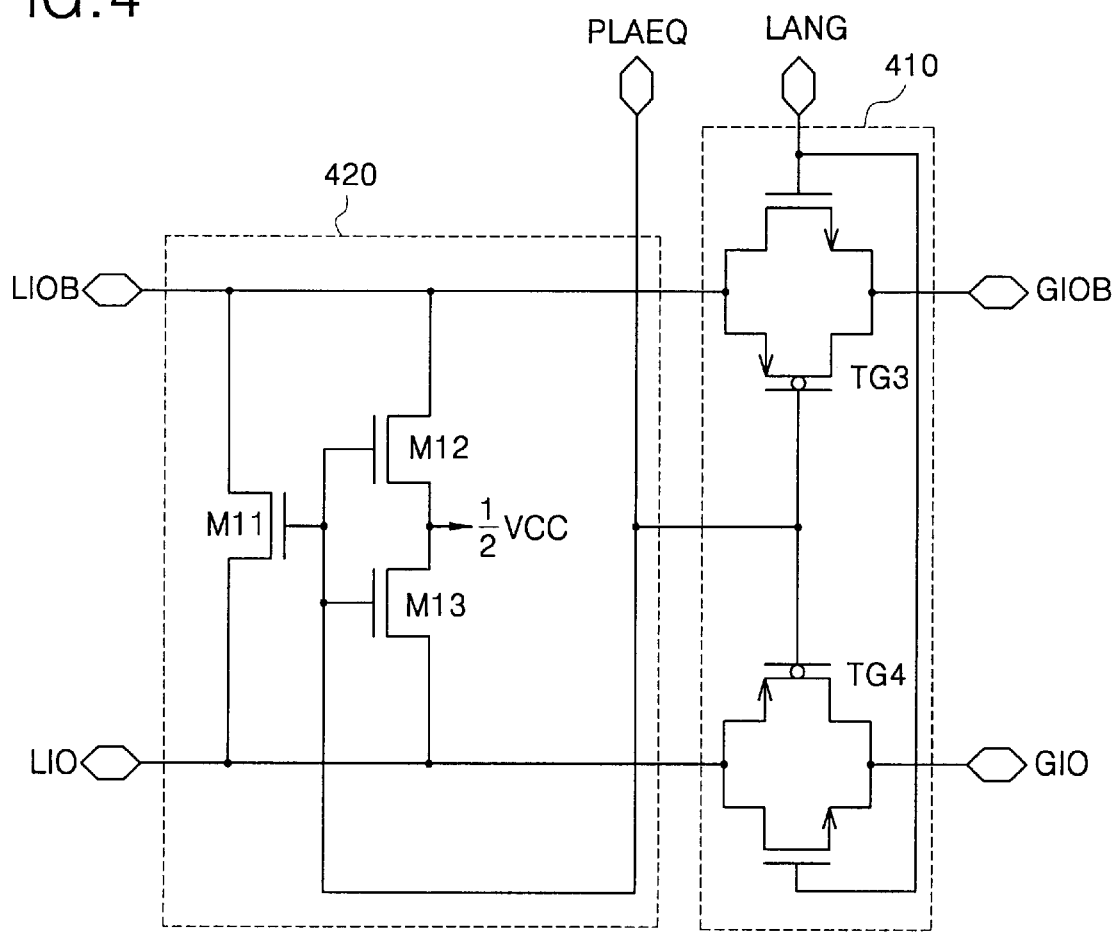
FIG. 4 is a schematic diagram of a line transfer circuit for connecting the global I/O lines pair to the local I/O lines pair shown in FIG. 2.
Figure 5:
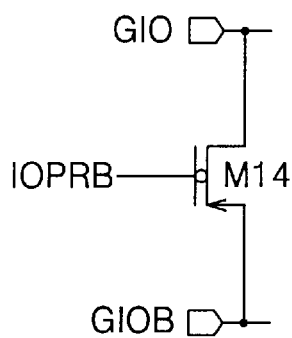
FIG. 5 is a schematic diagram of an equalizer means of the global I/O lines pair shown in FIG. 2.
Figure 6:
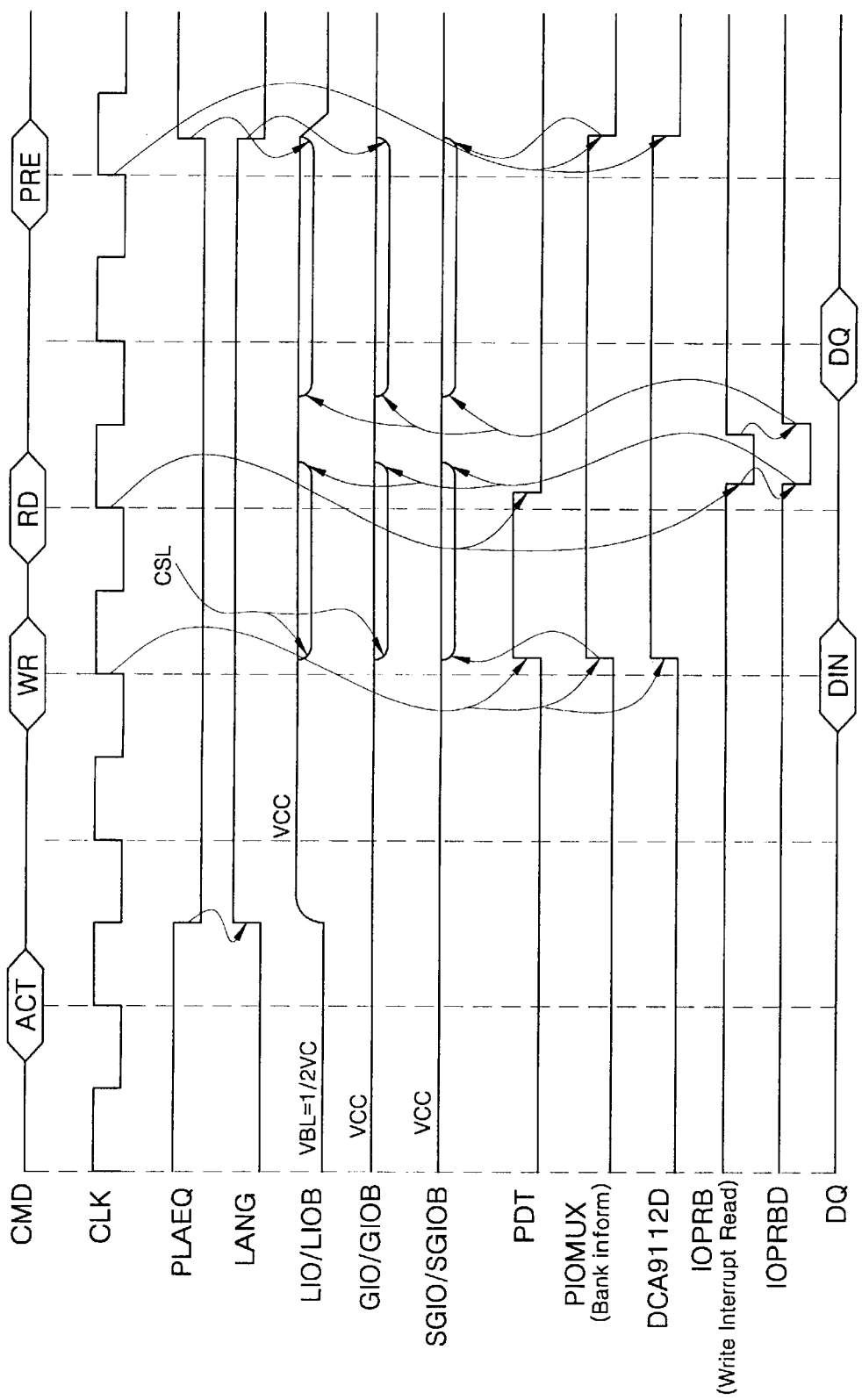
FIG. 6 a timing diagram of a write-interrupt-read operation of FIG. 2.

The spelling 'i' of 'GIOij' refers to a memory bank number, and 'j' refers to a local I/O lines pair number in the memory bank. Referring to FIGS. 4 and 6, a local I/O line pair LIOj is composed of the local lines LIO and LIOB. Referring to FIGS. 4, 5, and 6 a global I/O line pair GIOij is composed of the global lines GIO and GIOB.

The global I/O line pair GIO11 is connected with the first local I/O line pair LIO1 of the first memory bank MB1 at line transfer circuit blocks LT1 and LT3. The global I/O line pair GIO12 is connected with the second local I/O line pair LIO2 of the first memory block MB1, at the line transfer circuit block LT2.

The global I/O line pair GIO21 is connected to the first local I/O line pair LIO1 of the second memory bank MB2 at the line transfer circuit blocks LT1 and LT3. The global I/O line pair GIO22 is connected to the second local I/O line pair LIO2 of the second memory bank MB2 at the line transfer circuit block LT2.

The pair of global I/O line pairs (GIO11, GIO12) and (GIO21, GIO22) intersect each other at the column-decoder block CD1. In the second memory bank MB2, the global I/O line pairs GIO11 and GIO12 pass along the word-line driving block row WDR2, including the sense amplifier driving circuit blocks SD1~SD3. In the first memory bank MB1, the global I/O line pairs GIO21 and GIO22 pass over the word-line driving block row WDR2, including the sense amplifier driving circuit block SD1~SD3.

The global I/O line pairs GIO11 and GIO21 are connected to the I/O line sense amplifier IOSA1, and the global I/O line pairs GIO12 and GIO22 are connected to the I/O line sense amplifier IOSA2.

Accordingly, the read and write data from each memory bank addressed simultaneously are respectively provided to the I/O line sense amplifiers through the global I/O line pairs, these are disposed separately so that they do not interfere each other.

The positioning of the global I/O line pairs makes the capacitive load of the global I/O line pairs (GIO11, GIO12) and (GIO21, GIO22) equal.

According to the method above, pair of global I/O line pairs (GIO31, GIO32) and (GIO41 and GIO42) are disposed in the memory bank pair 10b.

Accordingly, the global I/O line pairs GIO11, GIO21, GIO31 and GIO41 are connected to the I/O line sense amplifier IOSA1 by multiplexing, respectively. The global I/O line pairs GIO12, GIO22, GIO32 and GIO42 are connected to the I/O line sense amplifier IOSA2 by multiplexing, respectively. Such a connection improves bank addressing.

Each of the global I/O line pairs includes equalizer means EQ1, EQ2, and EQ3. The equalizer means are connected to a line end point, and middle points between each memory bank and column-decoder block. The equalizer means equates the global I/O line pair in a write-interrupt-read mode to make a high-speed operation possible.

Figure 2:
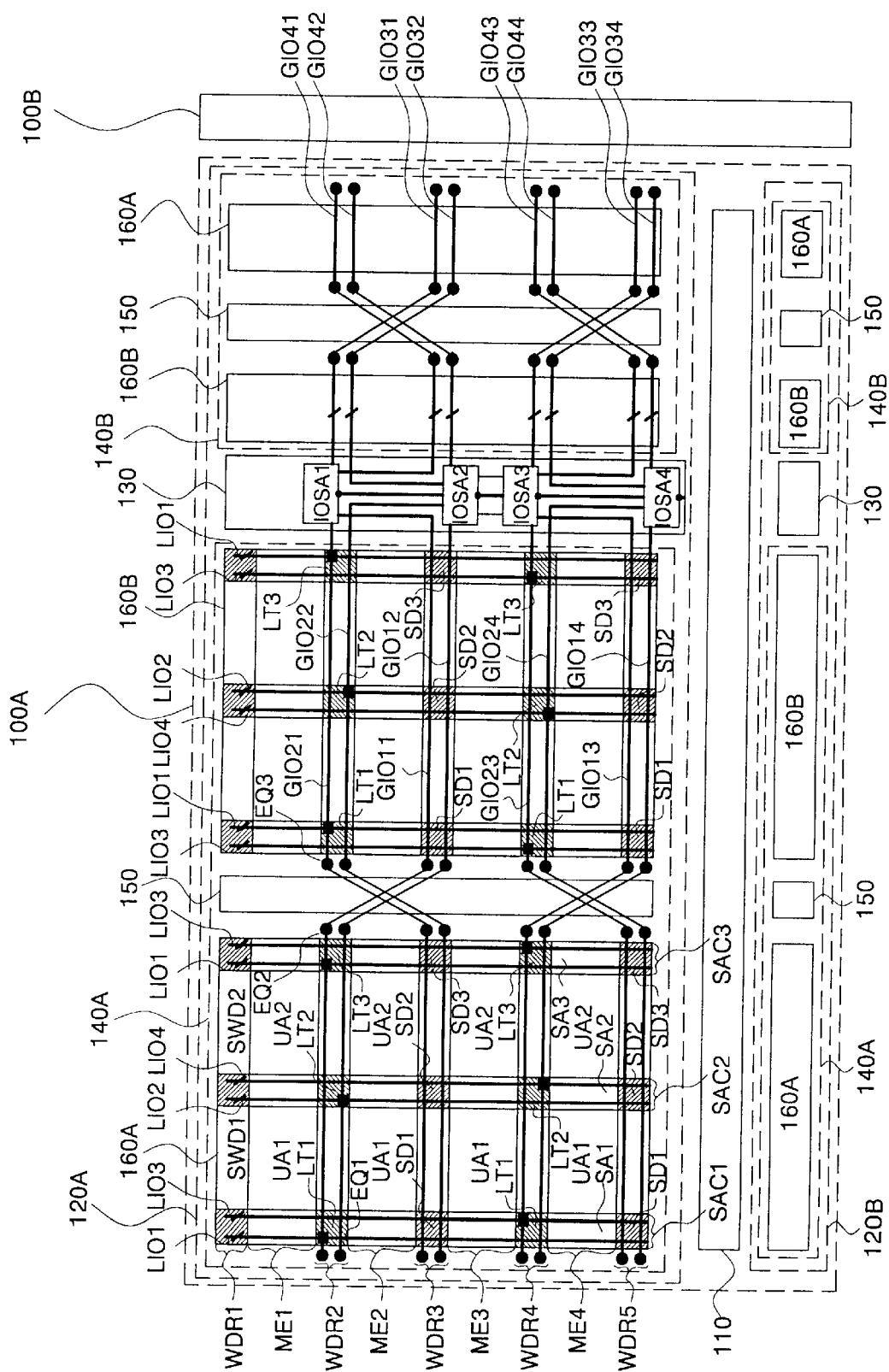
FIG. 2 is a schematic diagram of a multi-bank memory device according to one preferred embodiment of the present invention.

FIG. 2 illustrates a preferred embodiment of a multi-bank memory device according to the present invention. The multi-bank memory device of FIG. 2 includes a pair of element formation areas 100A and 100B divided on a semiconductor wafer. Each element formation area 100A and 100B is divided into a pair of sub-element formation areas 120A and 120B by a peripheral circuit area 110 disposed between the sub-elements. Each of the sub-element formation areas 120A and 120B is divided into a pair memory areas 140A and 140B by the I/O sense amplifier block 130. Each of the memory areas 140A and 140B is divided into a pair memory banks 160A and 160B by the column-decoder block 150 disposed between the memory banks.

At each of the memory banks 160A and 160B, four memory blocks ME1~ME4 and five word-line driving block rows WDR1~WDR5 are alternately disposed in the direction of a column. Each of the even numbered word-line driving block rows WDR2 and WDR4 includes two word-line driving blocks SWD1 and SWD2, and three line transfer circuit blocks LT1~LT3. Each of the odd numbered word-line driving block rows WDR1, WDR3 and WDR5 includes two word-line driving blocks SWD1 and SWD2, and three sense amplifier driving circuit blocks SD1~SD3.

At each of the memory blocks ME1~ME4, two unit arrays UA1 and UA2, and three sense amplifier blocks SA are alternately disposed in the direction of a row. A sense amplifier block column SAC1 comprises four sense amplifier blocks SA1 disposed in the same column, two line transfer circuit blocks LT1 disposed at the intersection area of the even numbered word-line driving block rows WDR2 and WDR4, and three sense amplifier driving circuit blocks SD1 disposed at the intersection area of the odd numbered word-line driving block rows WDR1, WDR3 and WDR5.

On each of the sense amplifier driving block columns SAC1~SAC3, a pair of local I/O line pairs (LIO1, LIO3), (LIO2, LIO4), and (LIO1, LIO3) pass, respectively, in the direction of the sense amplifier driving block columns.

On four word-line driving block rows WDR2~WDR5, a pair of global I/O line pairs (GIO11, GIO12), (GIO21, GIO22), (GIO13, GIO14) and (GIO23, GIO24) pass, respectively, in the direction of the word-line driving block rows.

On the memory bank 160B adjacent to the I/O sense amplifier block 130, a pair of the global I/O line pair GIO21 and GIO22 is extended along a first row WDR2. A pair of the global I/O line pair GIO11 and GIO12 is extended along a second row WDR3 adjacent to the first row WDR2. On the column-decoder block 150, the two pairs of the global I/O line pair (GIO11, GIO12) and (GIO21, GIO22) intersect each other. On the memory bank 160A adjacent to the column-decoder block 150, the pair of the global I/O line pair GIO21 and GIO22 is extended along the second row WDR3. A pair of the global I/O line pair GIO11 and GIO12 is extended along the first row WDR2.

On the memory bank 160B, adjacent to the I/O sense amplifier block 130, a pair of the global I/O line pair GIO23 and GIO24 is extended along a first row WDR4. A pair of the global I/O line pair GIO13 and GIO14 is extended along the second row WDR5 adjacent to the first row WDR4. On the column-decoder block 150, two pairs of the global I/O line pair (GIO23, GIO24) and (GIO13 and GIO14) intersect each other. On the other memory bank 160A adjacent to the column-decoder block 150, the pair of the global I/O line pair GIO23 and GIO24 is extended along the second row WDR5. The pair of the global I/O line pair GIO13 and GIO14 is extended along the first row WDR4.

In the memory bank 160A, the global I/O line pair GIO11 is connected to the local I/O line pair LIO1 at the line transfer circuit blocks LT1 and LT3 of the word-line driving block row WDR2. The global I/O line pair GIO12 is connected to the local I/O line pair LIO2 at the line transfer circuit blocks LT2 of the word-line driving block row WDR2. The global I/O line pair GIO13 is connected to the local I/O line pair LIO3 at the line transfer circuit blocks LT1 and LT3 of the word-line driving block row WDR4.

In the memory bank 160B, the global I/O line pair GIO21 is connected to the local I/O line pair LIO1 at the line transfer circuit blocks LT1 and LT3 of the word-line driving block row WDR2. The global I/O line pair GIO22 is connected to the local I/O line pair LIO2 at the line transfer circuit block LT2 of the word-line driving block WDR2. The global I/O line pair GIO23 is connected to the local I/O line pair LIO3 at the line transfer circuit blocks LT1 and LT3 of the word-line driving block row WDR4.

The global I/O line pair (GIO11, GIO12), (GIO21, GIO22), (GIO13, GIO14) and (GIO23, GIO24) include the equalizer means EQ1, EQ2 and EQ3. The equalizer means are connected to the end points of each global I/O line pair, separated from the I/O line sense amplifier block 130 to avoid interference. The equalizer means are also connected at the middle points between the memory banks 160A and 160B and the column-decoder block 150.

According to the method above, the pairs of global I/O line pair (GIO41, GIO42), (GIO31, GIO32), (GIO43, GIO44) and (GIO33, GIO34) are disposed in a memory area 140B symmetrically with the above-described memory area 140A.

Accordingly, the I/O line sense amplifier IOSA1 is connected to the global I/O line pairs GIO11, GIO21, GIO31 and GIO41, which are connected to the local I/O line pair LIO1 of the four memory banks, respectively. The I/O line sense amplifier IOSA2 is connected to the global I/O line pairs GIO12, GIO22, GIO32 and GIO42, which are connected to the local I/O line pair LIO2 of the four memory banks, respectively. The I/O line sense amplifier IOSA3 is connected to the global I/O line pairs GIO13, GIO23, GIO33 and GIO43, which are connected to the local I/O line pair LIO3 of the four memory banks, respectively. The I/O line sense amplifier IOSA4 is connected to the global I/O line pairs GIO14, GIO24, GIO34 and GIO44, which are connected to the local I/O line pair LIO4 of the four memory banks, respectively.

Therefore, the same I/O line pairs of four memory banks are connected simultaneously to one of the I/O line sense amplifiers by having the same addresses. So in the I/O line sense amplifier, it is possible to input and output the data by multiplexing or de-multiplexing four global I/O line pairs respectively connected with the memory banks.

Figure 3:
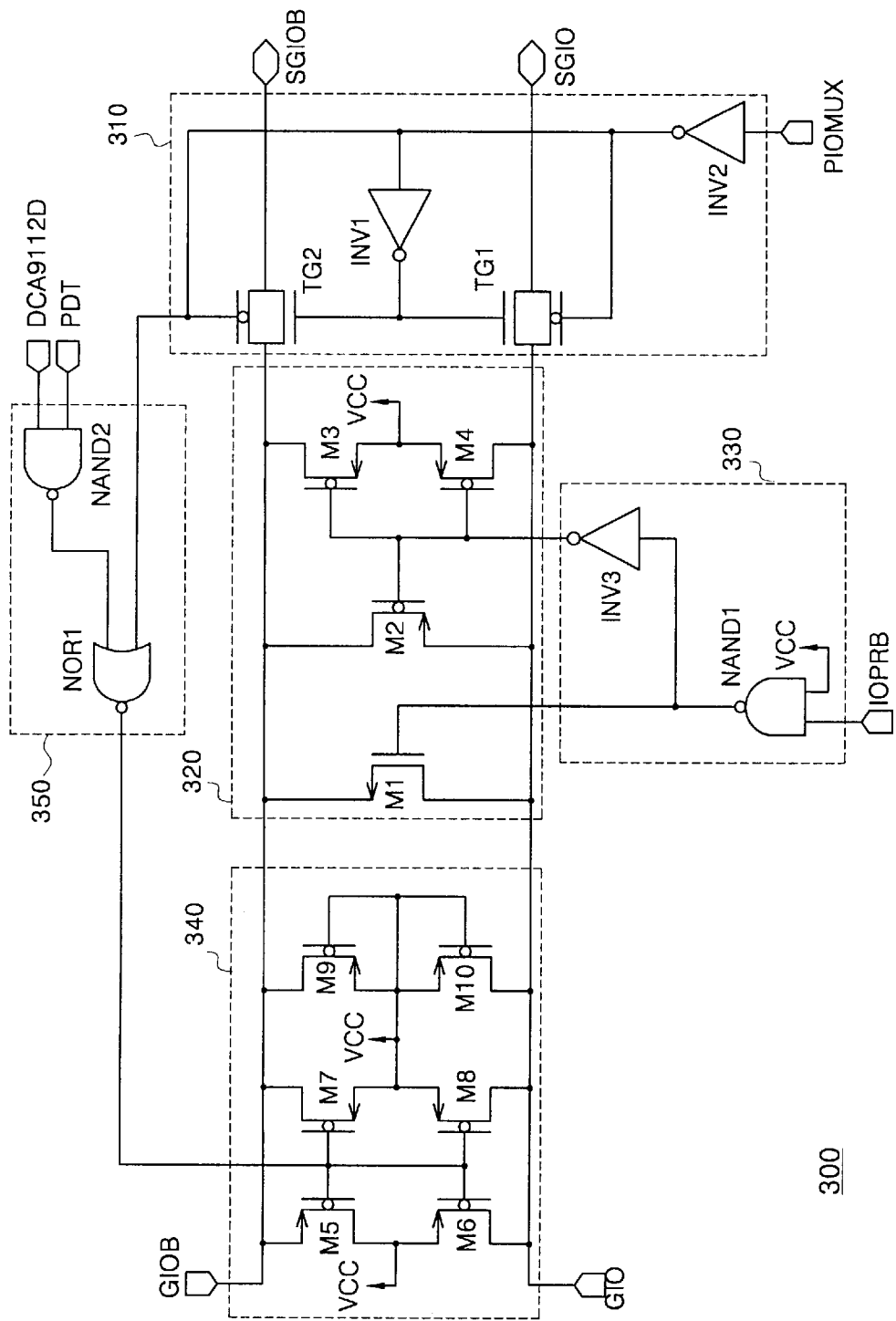
FIG. 3 is a schematic diagram of a line-input circuit for connecting an input portion of an I/O line sense amplifier to the global I/O lines pair shown in FIG. 2.

FIG. 3 illustrates a line-input circuit for connecting an input portion of the I/O line sense amplifier to a global I/O line pair of FIG. 2. The line-input circuit 300 includes a switching means 310, an equalizer means 320, an equalizer control means 330, a precharge means 340, and a precharge control means 350.

The switching means 310 includes transfer gates TG1 and TG2 and inverters INV1 and INV2. The switching means 310 turns on the transfer gates TG1 and TG2 in an active region, that is, in the high state of a bank information signal PIOMUX and connects global I/O line pairs GIO and GIOB with input line pairs SGIO and SGIOB of the I/O line sense amplifier.

The equalizer means 320 includes a NMOS transistor M1 and PMOS transistors M2, M3 and M4 connected between the global I/O line pairs GIO and GIOB. The equalizer control means 330 includes a NAND gate NAND1 and an inverter INV3.

Accordingly, the transistors of the equalizer means 320 are turned on in response to the equalizer control signal IOPRB which becomes active in response to a write-interrupt-read mode, and the global I/O line pairs GIO and GIOB are equated by a power supply voltage VCC.

The precharge means 340 includes PMOS transistors M5~M10 connected between the global I/O line pairs GIO and GIOB. The precharge control means 350 includes a NAND gate NAND2 and a NOR gate NOR1.

Accordingly, in case that a multi-bit mode signal DCA9112D and a write-interrupt-read signal PDT selects a corresponding bank by using a bank information signal PIOMUX, the global I/O line pairs GIO and GIOB are precharged by a power supply voltage.

FIG. 4 illustrates a line transfer circuit for connecting the global I/O line pairs with the local I/O line pairs of FIG. 2. The line transfer circuit LT of FIG. 4 includes a switching means 410 and an equalizer means 420.

The switching means 410 includes transfer gates TG3 and TG4, and connects the local I/O line pair LIO and LIOB with the global I/O line pair GIO and GIOB in response to a non-active region of an equalizer control signal PLAEQ and an active region of a line transfer signal LANG.

The equalizer means 420 includes transistors M11, M12 and M13 connected between the local I/O line pair LIO and LIOB, and equates the local I/O line pair LIO and LIOB in response to an active region of the equalizer control means PLAEQ with 1/2 VCC.

FIG. 5 illustrates the equalizer means of the global I/O line pairs shown in FIG. 2. The equalizer means EQ1~EQ3 of FIG. 2 comprises a PMOS transistor M14 connected between the global I/O line pair GIO and GIOB. Each of the equalizer means EQ1~EQ3 is turned on responding to an equalizer control signal IOPRB which becomes active in response to a write-interrupt-read mode, and equates the global I/O line pair GIO and GIOB.

FIG.6 shows a timing diagram explaining a write-interrupt-read operation of FIG.2. First, an ACT command (row active command) is inputted in response to a clock signal CLK, and then the equalizer control signal PLAEQ is changed from an active state to a non-active state in response to the ACT command, so that the line transfer signal LANG becomes active. Accordingly, the local I/O line pair LIO and LIOB are connected with the global I/O line pair GIO and GIOB through the line transfer circuit LT so that 1/2 VCC is changed to VCC.

Next, a DCA9112D signal, a PIOMUX signal and a PDT signal become active responding to a write command so that the external data is applied to the global I/O line pair GIO and GIOB. Therefore, one line of the global I/O line pair GIO and GIOB is transited to a predetermined level in response to the data applied to the global I/O line pair GIO and GIOB. In such a read operation, if an interrupt operation is performed and a read operation is inputted, the global I/O line pair GIO and GIOB are equated by VCC in response to a PDT signal, an IOPRB signal and an IOPRBD signal. Next, the data read from an addressed cell is outputted to an output terminal, and then the I/O line pair is precharged by a precharge operation and recovered to the state prior to an ACT operation.

As described above, the present invention has the following effects.

First, the invention improves chip efficiency by dividing a plurality of memory banks with I/O sense amplifier blocks.

Second, alternating the positions of I/O line transfer transistors and sense amplifier driving transistors leading to efficiency in manufacture and design.

Third, improving bank addressing by crossing global I/O line pairs.

Fourth, and improving an equalizing operation of global I/O line pairs in a write-interrupt-read mode.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A multi-bank semiconductor memory device, comprising:

a plurality of memory banks arranged in the direction of a row, each memory bank having a plurality of local I/O line pairs extended in a direction of a column, and a plurality of global I/O line pairs extended in a direction of a row;

an I/O sense amplifier block disposed between adjacent pairs of said plurality of memory banks, said I/O sense amplifier block having a plurality of I/O sense amplifiers arranged in the direction of a column; and a plurality of column-decoder blocks disposed between each adjacent pair of said memory banks, wherein at least one of said plurality of global I/O line pairs is extended from a first memory bank to an adjacent memory bank and intersects another global I/O line pair on said column-decoder block, and extends on a second memory bank in the direction of an adjacent row.

2. The multi-bank semiconductor memory device as recited in claim 1, wherein each of said plurality of local I/O line pairs is disposed on a plurality of sense amplifier block columns arranged in each memory bank in the direction of a row.

3. The multi-bank semiconductor memory device as recited in claim 2, wherein a pair of local I/O line pair is disposed on each of said sense amplifier block columns.

4. The multi-bank semiconductor memory device as recited in claim 3, wherein each of said plurality of global I/O line pairs is disposed on a plurality of word-line driving block rows arranged in each memory bank in the direction of a column.

5. The multi-bank semiconductor memory device as recited in claim 4, wherein a pair of global I/O line pair is disposed on each of said word-line driving block rows.

6. The multi-bank semiconductor memory device as recited in claim 5, wherein said plurality of global I/O line pairs are connected to local I/O line pairs intersected at the same word-line driving block row of each memory bank by having the identical addresses with said local I/O line pairs, respectively.

7. The multi-bank semiconductor memory device as recited in claim 6, wherein each of said plurality of global I/O line pairs is disposed on an adjacent word-line driving block row in a memory bank in which it is not connected with local I/O line pairs.

8. The multi-bank semiconductor memory device as recited in claim 7, wherein sense amplifier driving transistors are disposed at the intersection of sense amplifier block columns and word-line driving block rows in which said global I/O line pairs are not connected to local I/O line pairs.

9. The multi-bank semiconductor memory device as recited in claim 1, wherein each of said plurality of global I/O line pairs comprises a plurality of equalizer means which are connected to an end point being and to middle points between each memory bank and a column-decoder, and said plurality of equalizer means performing an equalizing operation in a write-interrupt-read mode.

10. A method for arranging input and output lines of a multi-bank semiconductor memory device which has a plurality of I/O sense amplifiers between adjacent pairs of a plurality of memory banks, comprising steps of:

extending a plurality of local I/O line pairs on each of said memory banks in the direction of a column: and extending one of a plurality of global I/O line pairs in the direction of a row from one memory bank to an adjacent memory bank, intersecting another global I/O line pair on a column-decoder disposed between said one and adjacent memory banks, wherein said one of the plurality of global I/O line pairs extends on the adjacent memory bank in the direction of an adjacent row.

11. The method as recited in claim 10, wherein each of said plurality of global I/O line pairs includes a plurality of equalizer means which are connected to an end point and to middle points between each memory bank and column-decoder, and said plurality of equalizer means performing an equalizing operation in a write-interrupt-read mode.

12. A multi-bank memory device, comprising:

a pair of element formation areas divided on a semiconductor wafer;

a peripheral circuit area for dividing each of said element formation areas into a pair of sub element formation areas;

an I/O sense amplifier block for dividing each of said sub element formation areas into a pair of memory banks;

a column-decoder block for dividing each of said memory areas into a pair of memory banks; and at least one of a plurality of global I/O line pairs extending in the direction of a first row, another pair is extended in the direction of a second row adjacent to said first row on a memory bank adjacent to said I/O sense amplifier block, said at least one and another pairs of global I/O line pairs intersect each other on said column-decoder block, and said at least one pair is extended in the direction of said second row, and said another pair is extended in the direction of said first row on a memory bank adjacent to said column decoder block.

13. The multi-bank memory device as recited in claim 12, wherein line pairs of said pairs are connected to I/O line sense amplifiers different from each other, respectively.

14. The multi-bank memory device as recited in claim 13, wherein a first pair of said global I/O line pair is connected to a local I/O line pair in a first memory bank, and a second pair of said global I/O line pair is connected with a local I/O line pair in a second memory bank.

15. The multi-bank memory device as recited in claim 14, wherein a global I/O line pair connected to an identical I/O line sense amplifier is connected to a local I/O line pair having the identical address in each memory bank.

16. The multi-bank memory device as recited in claim 15, wherein said local I/O line pairs are disposed on a plurality of sense amplifier block columns arranged in each memory bank in the direction of a row, respectively.

17. The multi-bank memory device as recited in claim 16, wherein a pair of local I/O line pair is disposed on each of said sense amplifier block columns.

18. The multi-bank memory device as recited in claim 16, wherein said plurality of global I/O line pairs are disposed on a plurality of word-line driving block rows arranged in each of memory banks in the direction of a column, respectively.

19. The multi-bank memory device as recited in claim 18, wherein a pair of global I/O line pair is disposed on each of said word-line driving block rows.

20. The multi-bank memory device as recited in claim 18, wherein said plurality of global I/O line pairs are connected to local I/O line pairs intersected at word-line driving block rows arranged in the direction of said second row, respectively.

21. The multi-bank memory device as recited in claim 20, wherein a sense amplifier driving circuit block is disposed at the intersection of word-line driving block rows arranged in the direction of said second row and sense amplifier block columns.

22. The multi-bank memory device as recited in claim 12, wherein said plurality of global I/O line pairs comprise a plurality of equalizer means which are connected to an end point and to middle points between each memory bank and column-decoder block, said plurality of equalizer means performing an equalizing operation in a write-interrupt-read mode.

* * * * *